(12) United States Patent
Khatri et al.

(10) Patent No.: US 7,694,195 B2
(45) Date of Patent: Apr. 6, 2010

(54) SYSTEM AND METHOD FOR USING A MEMORY MAPPING FUNCTION TO MAP MEMORY DEFECTS

(75) Inventors: Mukund P. Khatri, Austin, TX (US); Forrest E. Norrod, Austin, TX (US); Jimmy D. Pike, Georgetown, TX (US); Michael Sheperd, Pflugerville, TX (US); Paul D. Stultz, Cedar Park, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 11/838,687

(22) Filed: Aug. 14, 2007

(65) Prior Publication Data

US 2009/0049270 A1 Feb. 19, 2009

(51) Int. Cl.
*G11C 29/00* (2006.01)
(52) U.S. Cl. ...................................................... 714/723
(58) Field of Classification Search ................... 714/723
See application file for complete search history.

(56) References Cited

U.S. PATENT DOCUMENTS

| | | | |
|---|---|---|---|
| 4,209,846 A | 6/1980 | Seppa | |
| 4,240,143 A | 12/1980 | Besemer et al. | |
| 4,479,214 A | 10/1984 | Ryan | |
| 5,539,697 A * | 7/1996 | Kim et al. | 365/200 |
| 5,588,112 A | 12/1996 | Dearth et al. | |
| 5,758,056 A * | 5/1998 | Barr | 714/7 |
| 5,764,878 A * | 6/1998 | Kablanian et al. | 714/7 |
| 5,774,647 A | 6/1998 | Raynham et al. | |
| 5,862,314 A | 1/1999 | Jeddeloh | |
| 5,986,950 A | 11/1999 | Joseph | |
| 5,996,096 A | 11/1999 | Dell et al. | |
| 6,035,432 A | 3/2000 | Jeddeloh | |
| 6,052,798 A | 4/2000 | Jeddeloh | |
| 6,125,392 A | 9/2000 | Labatte et al. | |
| 6,154,851 A | 11/2000 | Sher et al. | |
| 6,158,025 A | 12/2000 | Brisse et al. | |
| 6,173,382 B1 | 1/2001 | Dell et al. | |

(Continued)

FOREIGN PATENT DOCUMENTS

EP 0704854 A1 4/1996

(Continued)

OTHER PUBLICATIONS

Partial European Search Report for 08014500.6, dated Nov. 12, 2008.

(Continued)

*Primary Examiner*—James C Kerveros
(74) *Attorney, Agent, or Firm*—Baker Botts L.L.P.

(57) ABSTRACT

A system and method are herein disclosed for managing memory defects in an information handling system. More particularly, a system and method are described for generating a usable memory map which excludes memory locations containing defect memory elements. In an information handling system, a memory defect map, which contains information about the location of defective memory elements, is coupled to the memory device. As a map of memory usable by the system is created, usable memory regions containing defective memory elements are excluded from the memory map. The memory map is passed to the operating system, which uses only those regions of memory designated as usable and non-defective.

20 Claims, 5 Drawing Sheets

U.S. PATENT DOCUMENTS

| | | | |
|---|---|---|---|
| 6,260,127 B1 | 7/2001 | Olarig et al. | |
| 6,304,989 B1* | 10/2001 | Kraus et al. | 714/733 |
| 6,324,657 B1* | 11/2001 | Fister et al. | 714/42 |
| 6,460,152 B1 | 10/2002 | Demidov et al. | |
| 6,499,117 B1 | 12/2002 | Tanaka | |
| 6,536,005 B1 | 3/2003 | Augarten | |
| 6,600,614 B2 | 7/2003 | Lenny et al. | |
| 6,601,183 B1 | 7/2003 | Larson et al. | |
| 6,622,269 B1 | 9/2003 | Ngo et al. | |
| 6,820,224 B1* | 11/2004 | Lin et al. | 714/710 |
| 7,065,630 B1 | 6/2006 | Ledebohm et al. | |
| 7,269,765 B1 | 9/2007 | Charlton et al. | |
| 7,272,758 B2* | 9/2007 | Roohparvar | 714/723 |
| 7,478,285 B2* | 1/2009 | Fouquet-Lapar | 714/42 |
| 2001/0042225 A1 | 11/2001 | Cepulis et al. | |
| 2002/0073353 A1 | 6/2002 | Fish et al. | |
| 2002/0120826 A1 | 8/2002 | Venkatraman et al. | |
| 2002/0157048 A1 | 10/2002 | Roohparvar | |
| 2002/0184445 A1 | 12/2002 | Cherabuddi | |
| 2003/0005367 A1 | 1/2003 | Lam | |
| 2003/0058711 A1 | 3/2003 | Benedix et al. | |
| 2003/0095455 A1 | 5/2003 | Dono et al. | |
| 2003/0145250 A1 | 7/2003 | Chin | |
| 2003/0208654 A1 | 11/2003 | Krontz et al. | |
| 2004/0034825 A1 | 2/2004 | Jeddeloh | |
| 2004/0042293 A1 | 3/2004 | Ogino | |
| 2004/0088614 A1 | 5/2004 | Wu | |
| 2006/0059383 A1 | 3/2006 | Roohparvar | |
| 2007/0174718 A1 | 7/2007 | Fouquet-Lapar | |

FOREIGN PATENT DOCUMENTS

| | | |
|---|---|---|
| JP | 2005/234744 A | 9/2005 |
| WO | WO98/02816 | 1/1998 |
| WO | 9905599 A1 | 2/1999 |
| WO | WO99/05599 | 4/1999 |
| WO | 9950748 A1 | 10/1999 |

OTHER PUBLICATIONS

Partial European Search Report for 08014498.3, dated Nov. 12, 2008.
Wikipedia—"BIOS Interrupt Call"—http://en.wikipedia.org/wiki/bios_interrupt_call.
Wikipedia—"Interrupt Descriptor Table"—http://en.wikipedia.org/wiki/interrupt_descriptor_table.
Supplementary European Search Report for EP 08 01 4498, dated Mar. 2, 2009.
Supplementary European Search Report for EP 08 01 4500, dated Mar. 2, 2009.
Official Action for EP 08 014 500.6, dated May 13, 2009.
International Search Report and Written Opinion for Singapore Patent Application No. 200805821-6, dated May 4, 2009.
International Search Report and Written Opinion for Singapore Patent Application No. 200805817-4, dated May 28, 2009.
Partial European Search Report for EP 08 014 502.2 dated Aug. 11, 2009.
Singapore Office Action for Application No. 200805816-6, dated Mar. 30, 2009.

* cited by examiner

SYSTEM AND METHOD FOR USING A MEMORY MAPPING FUNCTION TO MAP MEMORY DEFECTS

TECHNICAL FIELD

The present disclosure relates generally to computer systems and information handling systems, and, more particularly, to a system and method for creating a map of memory which governs its use by the computer system or information handling system.

BACKGROUND

As the value and use of information continues to increase, individuals and businesses seek additional ways to process and store information. One option available to these users is an information handling system. An information handling system generally processes, compiles, stores, and/or communicates information or data for business, personal, or other purposes thereby allowing users to take advantage of the value of the information. Because technology and information handling needs and requirements vary between different users or applications, information handling systems may vary with respect to the type of information handled; the methods for handling the information; the methods for processing, storing or communicating the information; the amount of information processed, stored, or communicated; and the speed and efficiency with which the information is processed, stored, or communicated. The variations in information handling systems allow for information handling systems to be general or configured for a specific user or specific use such as financial transaction processing, airline reservations, enterprise data storage, or global communications. In addition, information handling systems may include or comprise a variety of hardware and software components that may be configured to process, store, and communicate information and may include one or more computer systems, data storage systems, and networking systems.

An information handling system will typically include some type of temporary information storage medium, such as random access memory. In recent computers, the amount of memory comprised by the information handling system may be on the order of gigabytes. As memory size increases, the likelihood that part of the memory will either be manufactured defective or become defective over time increases dramatically. If left unmanaged, the presence of defective memory cells, regardless of their size, can cause the information handling system to fail. Such failure can initiate an abrupt end to the current operation of the information handling system, resulting in the loss of critical data, or can prevent the information handling system from starting up altogether.

As systems continue to evolve and computer technology advances, the operational relationship between the CPU and memory becomes more profound. Many attributes of modern systems (specifically the introduction of multi-core processors and virtualization in general) are forcing an ever-growing memory footprint. Consequently, not only is system memory growing to be a much more substantial percentage of the overall solution cost, but the impact of erroneous behavior in the memory can have a much more adverse effect on the life cycle expense associated with service. Traditionally, embedded error correction schemes have successfully been used to avoid "crashes" on a single bit error and to detect multi-bit corruptions. However, as memory geometries become smaller and memory size grows larger, it is necessary to add another level of service protection that is quickly available and resident on the memory module itself.

SUMMARY

In accordance with the present disclosure, a system and method are herein disclosed for managing memory defects in an information handling system. More particularly, the present disclosure comprises a system and method for generating a usable memory map which excludes memory locations containing defect memory elements. In an information handling system, a local memory defect map, which comprises information about the location of defective memory elements within a memory device, is coupled to the memory device. BIOS uses the local memory defect map to generate a system memory defect map. As a map of memory usable by the system is created, usable memory regions containing defective memory elements are excluded from the usable memory map. The usable memory map is passed to the operating system piece by piece, which uses only those regions of memory designated as usable and non-defective.

The system and method disclosed herein are technically advantageous because a mechanism is provided for reducing the functional and financial impact of defective memory elements. In particular, the present disclosure provides a way for an information handling system to operate normally, despite the presence of one or more defective memory elements, with minimal impact on system performance. By effectively hiding defective memory blocks from the operating system, crashes of the information handling system are better avoided. In addition, by sequestering defective memory elements, the present disclosure extends the life of memory. Overall system costs for the information handling system are correspondingly reduced as memory need not be replaced even after multiple memory elements are found to be defective.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communication with external devices as well as various input and output (I/O) devices, such as a keyboard, a mouse, and a video display. The information handling system may also include one or more buses operable to transmit communications between the various hardware components.

Figure 1:
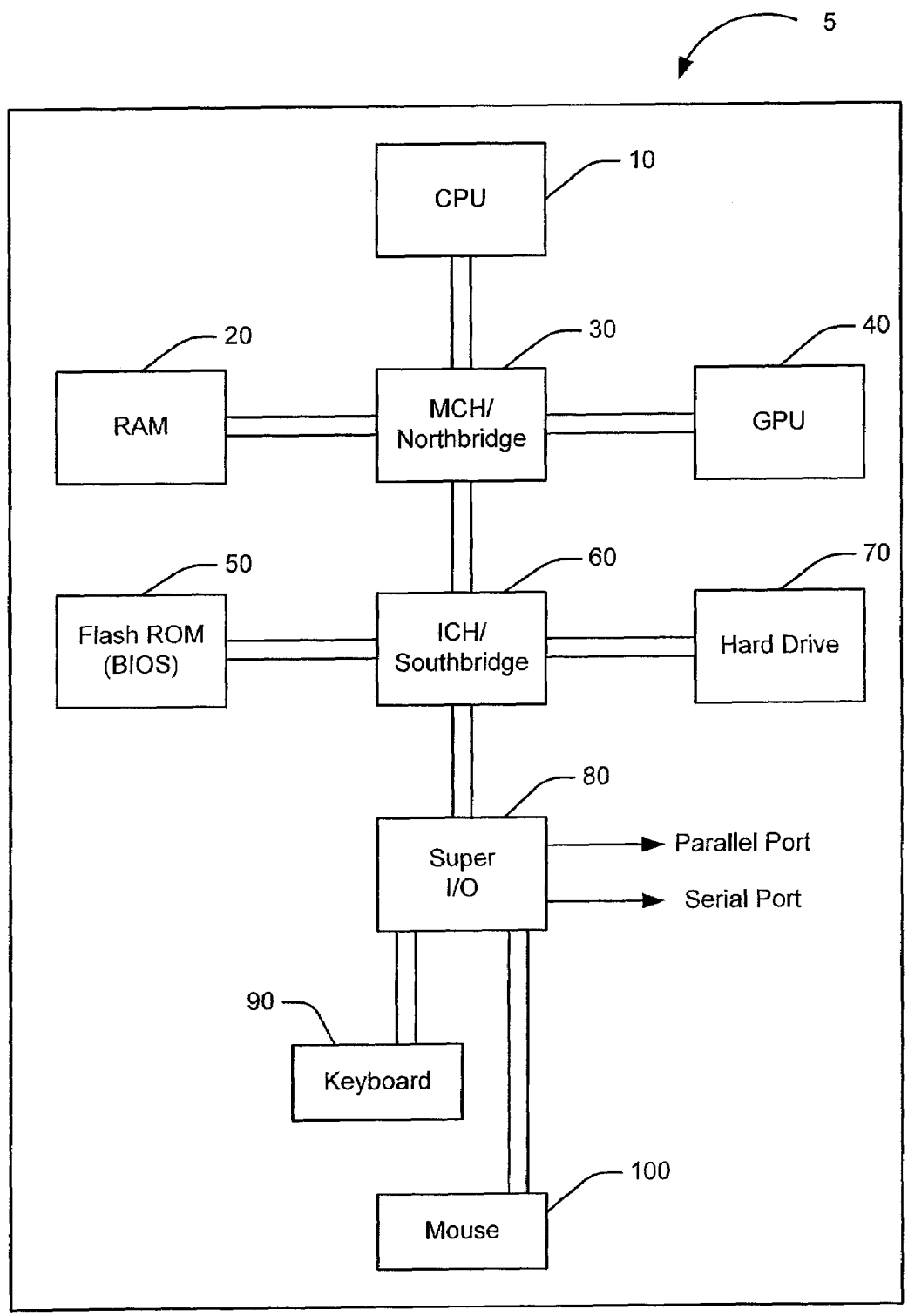
FIG. 1 is a block diagram of a typical information handling system.

Shown in FIG. 1 is a block diagram of a typical information handling system. A processor or CPU 10 of the typical information handling system 5 is communicatively coupled to a memory controller hub or northbridge 30. Memory controller hub 30 is coupled to memory 20 and a graphics processing unit 40. Memory controller hub 30 is also coupled to an I/O controller hub or southbridge 60. I/O hub 60 is coupled to storage elements of the computer system, including a storage element 50 such as flash ROM for the BIOS of the computer system and the hard drive 70 of the computer system. I/O hub 60 may also be coupled to a Super I/O chip 80, which is itself coupled to many of the I/O ports of the computer system, including keyboard 90, mouse 100, and parallel ports.

During startup of the information handling system 10, the components of the system are initialized during BIOS setup. The initialization process includes mapping the system memory that will be available to the operating system (OS) once the initialization is complete. The system memory map is created by BIOS and communicated to the OS through the memory mapping call, such as INT15-E820. During BIOS initialization, memory defect information stored in local memory defect maps is translated into a system memory defect map. The operating system uses iterative calls to the BIOS memory mapping functions to generate the complete usable memory map. The complete map details usable, non-usable, and ACPI reclaimable address ranges.

Figure 2A:
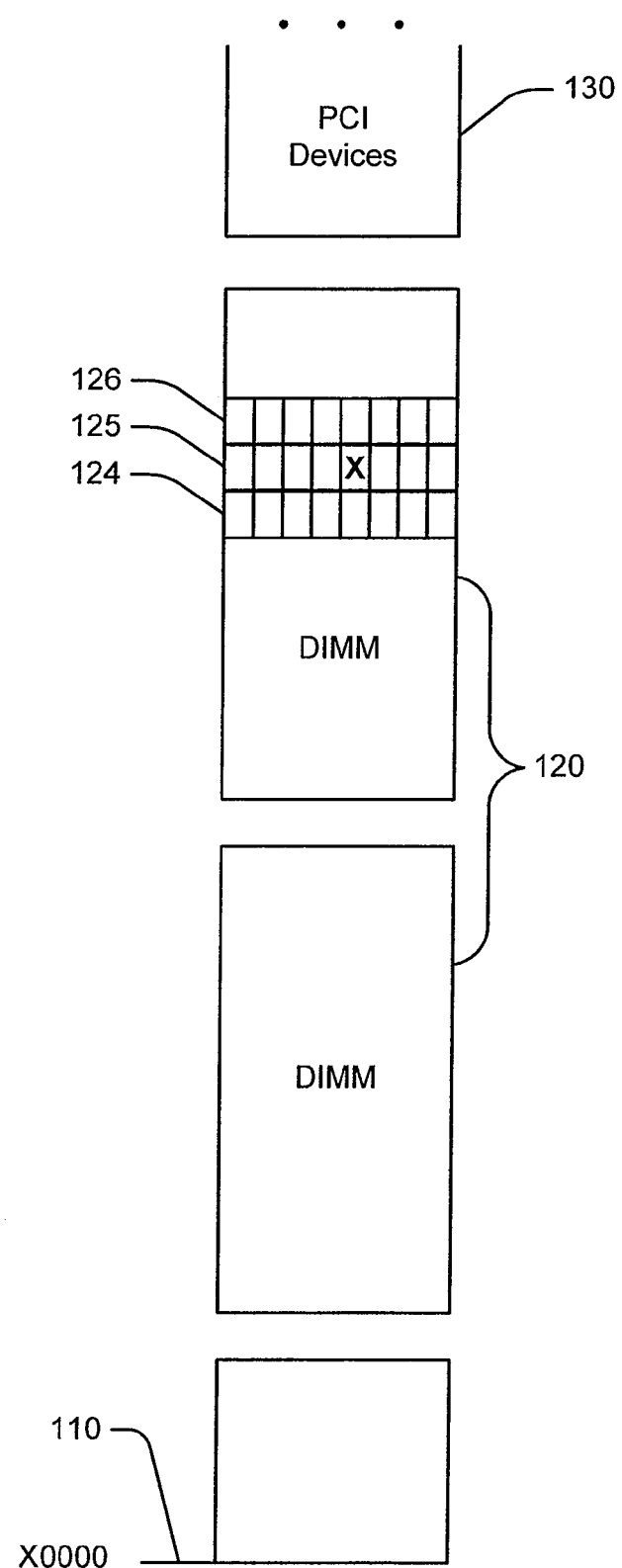
FIG. 2A shows the addressable memory space for a typical information handling system.

FIG. 2A is a diagram of the memory space that is reviewed by a memory mapping call, such as an E820 call, within the information handling system. The information handling system 10 may be comprised of numerous distinct components capable of being addressed as memory, including dual inline memory modules (DIMMs) 120 and PCI devices 130, such as discrete graphics cards. Devices that include addressable memory are detected during the BIOS initialization period, and the memory within these devices is scanned and identified as system-accessible memory during the memory scanning operation. The memory scanning operation results in the iterative interrogation of possible memory locations, beginning with memory having the lowest possible address 110 within the system. The memory scanning operation reviews all addressable memory locations in succession, including memory blocks 124, 125 and 126, even though memory block 125 contains a memory defect. As system-accessible memory is located, including DIMMs 120, memory regions are identified based on the type of memory in that region. These type-based memory region designations may be stored in numerous locations, including CMOS or RAM.

Consistent with this disclosure, the BIOS also generates a system memory defect map during POST based on known memory defects. Information regarding previously detected memory defects may be stored in a number of locations, including the serial presence detect (SPD) EEPROM of the DIMM module that includes the associated defective memory cell. During BIOS initialization, the stored local memory defect map is read to determine the location of memory defect blocks in the corresponding DIMM. This information is then translated into a system memory defect map which stores information for identifying defective memory blocks at the system level. In the system memory defect map, for instance, the memory defect blocks may be represented by a starting address in the system memory address space, the length of the memory block, and a flag indicating whether the memory block contains defective memory or not. By contrast, the local memory defect map for each memory device may simply be a series of flags representing the presence or absence of defective memory in sequentially identified blocks of the corresponding memory device. More sophisticated local memory defect maps are possible, but regardless of complexity, the information in the local memory defect map should be translated into the system memory address space used by the OS. This function is best performed by the BIOS, though the OS could do the same.

The OS ultimately identifies the usable memory available to it by calling a memory mapping function such as an INT15-E820 call. Consistent with this disclosure, the memory mapping function reads the memory types of the memory regions identified by the memory scanning operation, and also reads the system memory defect map. The memory mapping function may check for overlaps to determine whether the memory defect blocks indicated by the system memory defect map coincide with the boundaries of the memory type regions identified by the memory scanning operation. The memory mapping function then returns information to the OS indicating the next region of usable memory. Because the system memory defect map is consulted during the E820 call, defective memory blocks will not be identified as usable memory. As a result, the operating system has no knowledge of or access to the defective memory, but instead sees only the usable and non-defective memory. Defective memory is thus effectively quarantined without the use of software and without any decrease in hardware performance.

Figure 2B:
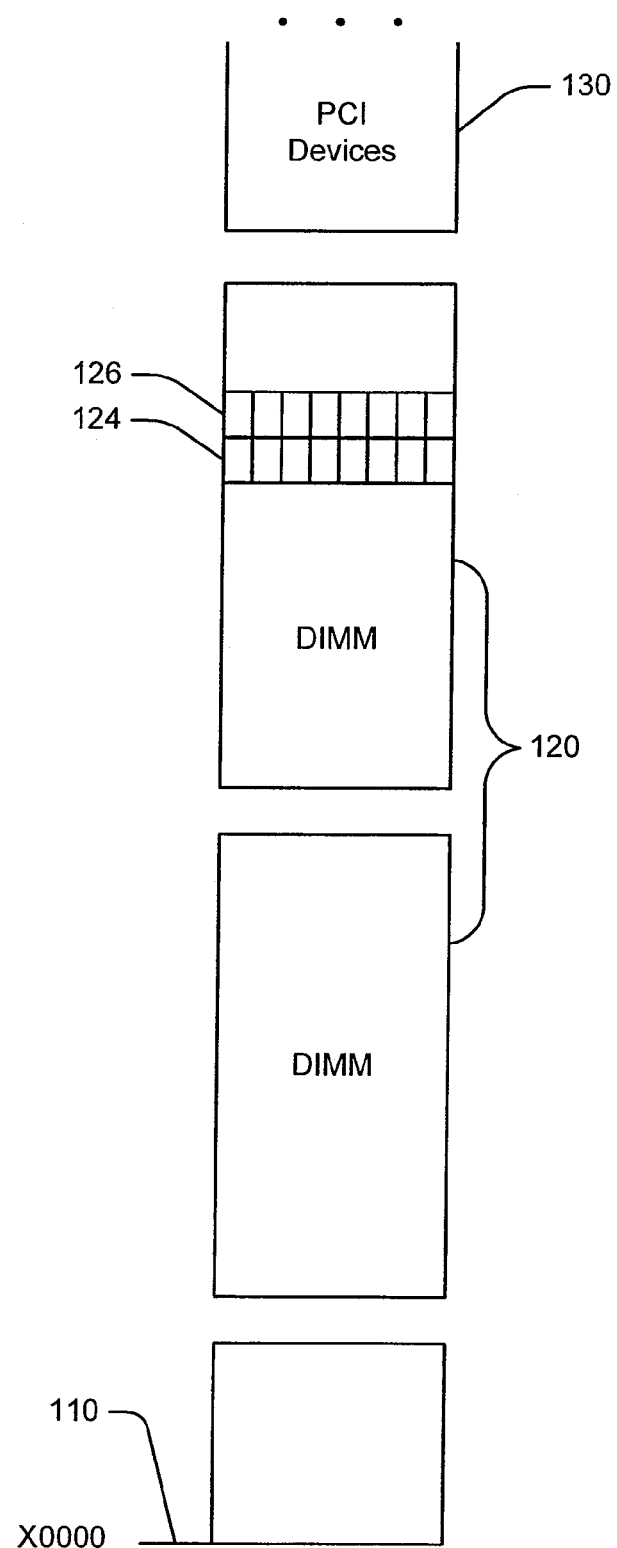
FIG. 2B shows the memory space included in a usable memory map which excludes defect blocks.

FIG. 2B is a diagram of a usable memory map in which the unusable or defective locations in the memory of the computer system have been logically mapped out of the computer system. For example, memory blocks 124 and 126 are included in the usable memory map, but memory block 125, which contains a defective memory element, is not.

One method of mapping out defective memory blocks involves creating the entire system memory defect map during BIOS power-on self-test (POST) and storing each memory map entry until the OS requests it. Because each standard E820 entry is 20 bytes, however, mapping any significant number of defects with this method requires a large quantity of storage. For an 8 DIMM system supporting 8 defects per DIMM, for example, this method would create 64 reserved entries and 64 usable entries, as well as standard entries for base memory, HECBase, reclaim area and reserved area below 4 GB. This totals 132 entries, or 2640 bytes from the BIOS runtime area. This quantity of storage is sufficiently large to require placement in a reserved memory area outside F000, slowing down access to the map information and tying up limited memory resources.

Another method of mapping the memory could entail scanning the local memory defect map, for example from a DIMM's SPD, during E820 entry creation, interpreting the local memory defect map and returning holes in real time as the OS calls the memory mapping function. This method requires significant time to process the data, however, causing longer boot-up times.

In a third method for building the system memory defect map with defect information, the map would be built during POST for all of the reserved areas described in the DIMM defect data. Using efficient addressing techniques, the size of each entry could be reduced to as little as 8 bytes. In the 8 DIMM system described previously, the entire map would be as small as 512 bytes, a reduction in size by a factor of 5. This method requires a more intelligent memory mapping function than the current version of the E820 call, and could implement, for instance, an algorithm to retain pointer offset in the memory defect map (located, for instance, in the DIMM SPD) created during POST and scanning forward and backward in the structure to determine next entry types, overlaps, etc.

Figure 3:
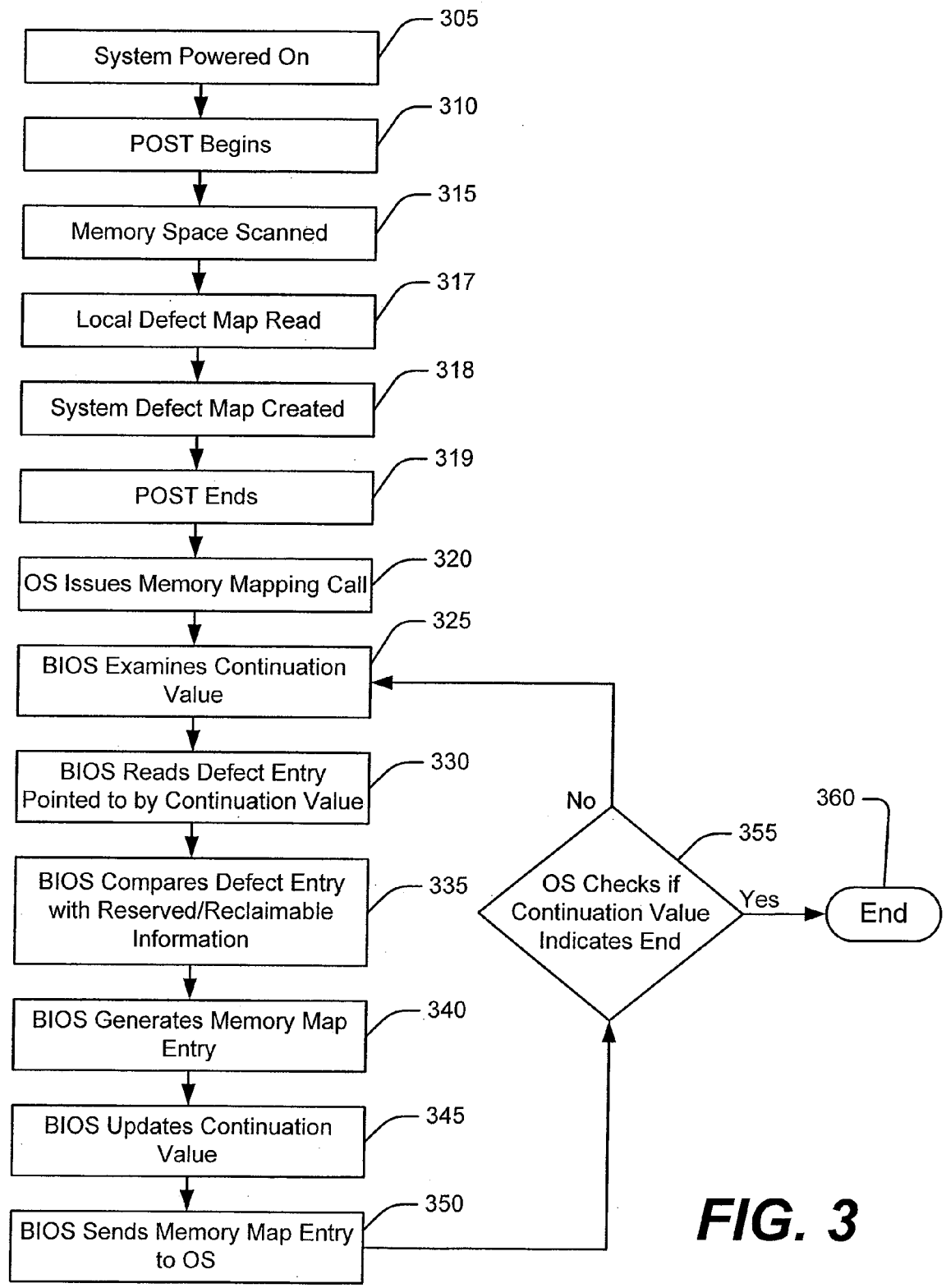
FIG. 3 is a flow diagram depicting an implementation of a memory mapping function.

In one example of a more efficient memory mapping algorithm, a continuation value would temporarily store information about the progress of the iterative calls to the memory mapping function. The continuation value could be stored, for example, in the BX register of a typical information handling system. FIG. 3 depicts one possible sequence of events implementing an efficient memory mapping algorithm. The system is initially powered on 305 and begins the POST process 310. As part of the POST, the memory space is scanned 315 to determine which locations are reserved for other devices, which are reclaimable, and which are usable. Next, the local memory defect map is read 317, followed by the creation of the system memory defect map 318. After the POST process concludes 319, the OS initiates the first memory mapping call 320.

During the memory mapping call, the BIOS first examines the continuation value 325 to determine where the previous call, if any, left off. If no previous calls have been made, the continuation value will still be in its initialized state, pointing to the zero address of the memory defect map. The BIOS reads the memory defect map entry at the offset indicated by the continuation value 330 and compares that memory location against the reserved and reclaimable memory addresses 335 determined during its previous memory scan 315 and stored in CMOS or memory. After reconciling any overlaps, the BIOS generates the memory map entry requested by the memory mapping function call 340. Before passing the memory map entry to the OS 350, however, the BIOS updates the continuation value to reflect its progress through the memory defect map 345. Once the memory map entry is sent to the OS 350, the OS determines whether or not the continuation value indicates the end of the usable memory space 355. If so, the memory mapping function is complete at the iterative process terminates 360. If not, the memory mapping call is repeated, beginning with the BIOS examining the continuation value to determine where it left off 325.

Those skilled in the art will recognize that the continuation value could be structured in numerous ways to implement the foregoing memory mapping algorithm. In one implementation, a single bit could be used to determine whether the next memory map entry falls within a defective memory block. Assuming a memory defect map size of 128 entries or less, seven bits would be sufficient to store an offset to either the current or previous location read from the memory defect map during the memory mapping iterations. Another bit could be used to determine whether or not the current memory location is above the 4 GB threshold or not, and two more bits could serve as a counter to indicate how many entries have been created since crossing the 4 GB threshold.

To further reduce the large size of individual memory map entries, the excess addressability of the fields of each memory map entry can be trimmed. In traditional E820 maps, for instance, each memory map entry includes a base address, the size of the memory block being sent to the memory map, and the type of memory. When excluding defective memory elements from the memory map, the length of the memory map entry field corresponding to the size of the memory block at issue can be reduced to the megabyte range, since DIMMs with capacity greater than 1 GB are still fairly rare. Likewise, since only three general types of memory are returned to the OS, the length of the memory map entry field denoting memory type could be reduced to as little as two bits.

Figure 4:
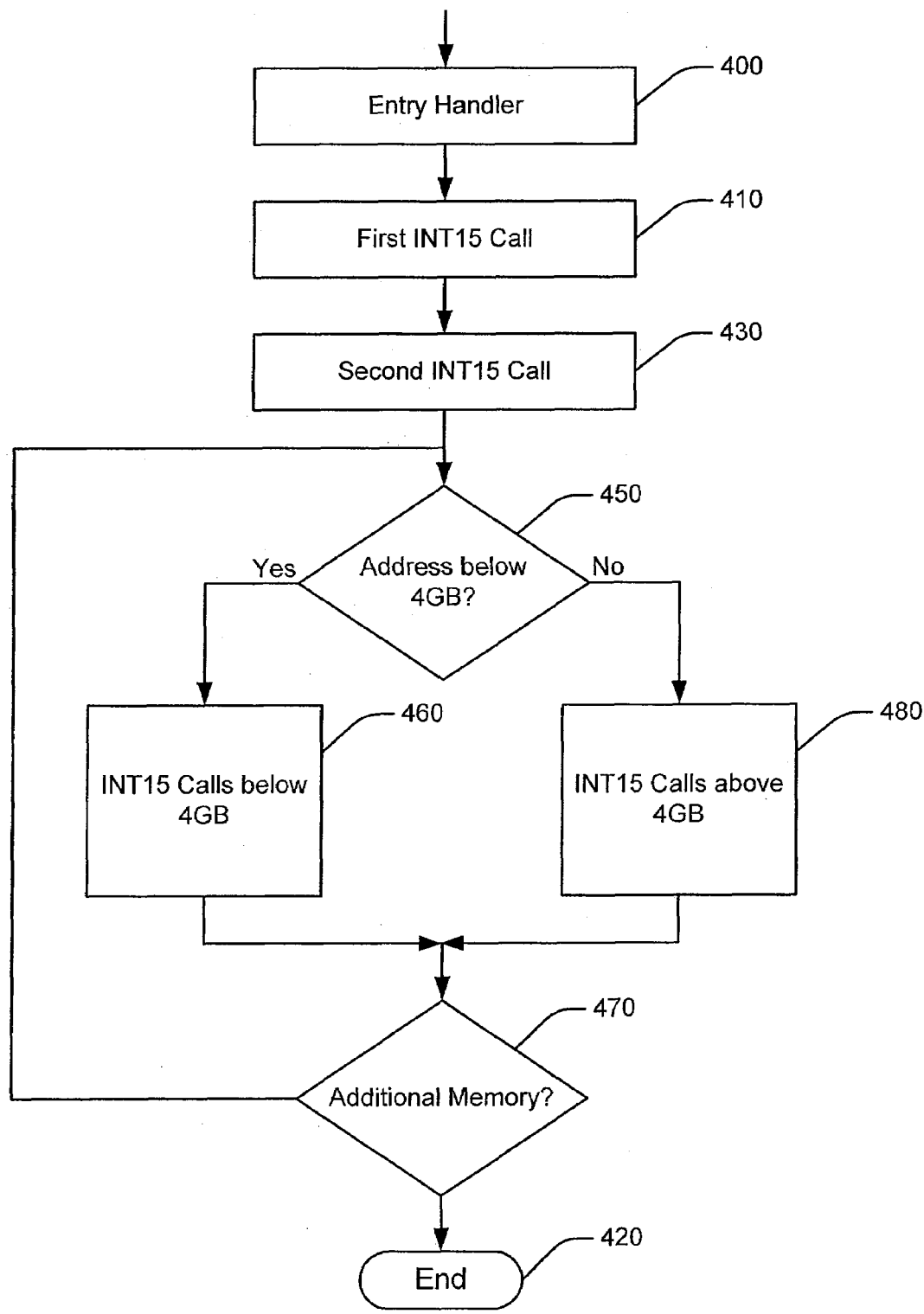
FIG. 4 shows the code flow for an implementation of a memory mapping call.

FIG. 4 depicts one possible code sequence to implement the third method above, where the system memory defect map is built during POST for the entries found in the local memory defect map. First, an entry handler 400 uses a continuation value to determine special handling routines for calling specific routines as well as basic fault checks. Next, the first INT15 E820 call 410 is made. During the first INT15 call 410, offsets are initialized into tables and returned entries and the standard base memory area is returned. The second INT15 call 430 comprises five steps. First, the information handling system checks for valid memory defect entries and overlaps for a start address. Next, the structure data is checked for invalid ranges and sizes. Third, the information handling system checks for the next entry type and overlaps with reserved areas. Fourth, flags and offsets are set for the next entry type and routine calls are made. Finally, the needed entry type is return with its associated address and range.

Subsequent INT15 calls differ for memory ranges above 4 gigabytes and below 4 gigabytes. If the memory range is blow 4 gigabytes, the INT15 call 460 first checks for offsets and flags to determine the entry log type required. Next, the structure data is checked for invalid ranges and sizes. Third, the information handling system checks for overlaps and required ranges. Fourth, the information handling system scans through structures to determine the next entry, setting flags and offsets. Fifth, the needed entry type is returned with its associated address and range. Finally, the system checks if the current entry is the last entry below 4 GB. For INT15 calls above 4 GB 480, the information handling system first checks for valid structure entries and overlaps. Next, the information handling system checks the structure data for invalid ranges and sizes. Third, flags and offsets are set for the next entry. Finally the needed entry type is returned with the calculated address and range.

Although this disclosure has been described with respect to the creation of a usable memory map, such as an E820 map, in an information handling system, it should be recognized that the memory mapping system and method described herein may be implemented with any physical storage device with potential defects. Although the present disclosure has been described in detail, it should be understood that various changes, substitutions, and alterations can be made hereto without departing from the spirit and the scope of the invention as defined by the appended claims.

What is claimed is:

1. A system for managing memory defects, comprising:
   an information handling system;
   an operating system;
   a memory, wherein the memory is characterized by a type;
   a memory location for storing a memory defect map, wherein the memory defect map comprises information regarding the location of regions of said memory which contain defective memory elements; and
   wherein the information handling system is configurable to initiate a memory mapping function, wherein the memory mapping function is operable to determine the type of memory for each memory identified by a memory scanning operation, create a map of usable memory, based, at least in part, on the type of memory, and send the map of usable memory to the operating system, and wherein the memory mapping function is further operable to reference the memory defect map and exclude memory regions containing defective memory elements from the usable memory map.

2. The system of claim 1, wherein the memory location for storing the memory defect map is physically coupled to the memory.

3. The system of claim 1, wherein the memory mapping function is a modification of the INT15-E820 memory description call.

4. The system of claim 1, wherein the memory mapping function is called before the operating system is initialized.

5. The system of claim 1, wherein the entire usable memory map is built during the power-on self-test period of the information handling system.

6. The system of claim 1, wherein the usable memory map is generated by scanning the memory defect map during the creation of each entry in the usable memory map.

7. The system of claim 1, wherein the usable memory map is built during power-on self-test for each of the reserved memory regions indicated in the memory defect map.

8. The system of claim 1, wherein the size of memory map entries is reduced by referencing memory through offsets.

9. The system of claim 1, wherein the size of memory map entries is reduced by limiting the length of the field corresponding to the size of a memory block.

10. The system of claim 1, wherein the size of memory map entries is reduced by limiting the length of the field corresponding to the type of memory being mapped during the call.

11. The system of claim 1, wherein a continuation value register stores information about the progress of the memory mapping function.

12. The system of claim 11, wherein the continuation value register comprises an offset value pointing to a location in the memory defect map.

13. The system of claim 11, wherein the continuation value register comprises information about the type of memory identified by the following usable memory map entry.

14. A method of managing memory defects in an information handling system comprising the steps of:
   determining a type of memory for each memory region identified by a memory scanning operation;
   storing a memory defect map comprising information about the location of defective memory elements;
   creating a map of available memory for use by the information handling system, based, at least in part, on the type of memory;
   excluding from the map of available memory regions of memory containing defect memory elements; and
   making the map of available memory accessible to the operating system.

15. The method of claim 14, wherein the entire map of available memory is built during the power-on self-test period of the information handling system.

16. The method of claim 14, wherein the map of available memory is generated by scanning the memory defect map during the creation of each entry in the map of available memory.

17. The method of claim 14, wherein the map of available memory is built during power-on self-test for each of the reserved memory regions indicated in the memory defect map.

18. A method for building a usable memory map, comprising the steps of:
   determining a type of memory for each of one or more regions of memory identified by a memory scanning operation;
   calling a memory mapping function;
   reading a continuation value;
   reading information from a memory defect map based on the continuation value, wherein a memory mapping function is operable to create a map of usable memory, and wherein the usable memory map is created based, at least in part, on the type of memory;
   excluding the regions of memory containing defective memory elements; and
   returning information regarding the location of usable and non-defective memory.

19. The method of claim 18, further comprising the step of determining whether an overlap exists between a memory range read from the memory defect map and other information regarding the type of memory in the memory range.

20. The method of claim 18, wherein the continuation value comprises information regarding the progress of the memory mapping function as it iterates through the memory defect map.

* * * * *

UNITED STATES PATENT AND TRADEMARK OFFICE
CERTIFICATE OF CORRECTION

PATENT NO. : 7,694,195 B2  Page 1 of 1
APPLICATION NO. : 11/838687
DATED : April 6, 2010
INVENTOR(S) : Khatri et al.

It is certified that error appears in the above-identified patent and that said Letters Patent is hereby corrected as shown below:

Title page, item [75] Inventors, replace "Sheperd" with --Shepherd--.

Signed and Sealed this

Fourteenth Day of September, 2010

David J. Kappos
*Director of the United States Patent and Trademark Office*